(12) United States Patent
Liu et al.

(10) Patent No.: US 9,506,967 B2
(45) Date of Patent: Nov. 29, 2016

(54) MULTI-DIMENSIONAL ELECTRODES FOR CAPACITIVE SENSING

(71) Applicant: INTEL CORPORATION, Santa Clara, CA (US)

(72) Inventors: Min Liu, Portland, OR (US); Steven L. Pearce, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 456 days.

(21) Appl. No.: 14/027,850

(22) Filed: Sep. 16, 2013

(65) Prior Publication Data

US 2015/0077139 A1    Mar. 19, 2015

(51) Int. Cl.

| G01R 27/26 | (2006.01) |
|---|---|
| G06F 3/041 | (2006.01) |
| G06F 3/045 | (2006.01) |
| G01B 7/00 | (2006.01) |
| G01R 3/00 | (2006.01) |
| G06F 3/01 | (2006.01) |
| G06F 3/044 | (2006.01) |

(52) U.S. Cl.
CPC ........... *G01R 27/2605* (2013.01); *G01B 7/003* (2013.01); *G01R 3/00* (2013.01); *G06F 3/017* (2013.01); *G06F 3/041* (2013.01); *G06F 3/044* (2013.01); *G06F 2203/04101* (2013.01); *Y10T 29/49117* (2015.01)

(58) Field of Classification Search
CPC ........ G06F 3/041; G06F 3/044; G06F 3/017; G01R 27/2605
USPC .......................... 324/658, 686; 345/173, 174
See application file for complete search history.

(56) References Cited

U.S. PATENT DOCUMENTS

| 6,025,726 A * | 2/2000 | Gershenfeld ........... B60N 2/002 324/662 |
|---|---|---|
| 2007/0213943 A1 | 9/2007 | Curry et al. |
| 2010/0097374 A1* | 4/2010 | Fan ...................... A61B 5/0535 345/420 |
| 2010/0292945 A1 | 11/2010 | Reynolds et al. |
| 2011/0062971 A1 | 3/2011 | Badaye |
| 2012/0188206 A1 | 7/2012 | Sparf et al. |
| 2012/0310572 A1 | 12/2012 | Jordan |
| 2014/0198058 A1* | 7/2014 | Warden .................. G06F 3/0416 345/173 |

FOREIGN PATENT DOCUMENTS

| CN | 103116432 A | 5/2013 |
|---|---|---|
| TW | 200923746 A | 6/2009 |
| TW | 201234240 A | 8/2012 |

OTHER PUBLICATIONS

Taiwan IPO Search Report, Application No. 103131337, completed Dec. 2, 2015, 2 pages.

* cited by examiner

*Primary Examiner* — Amy He
(74) *Attorney, Agent, or Firm* — International IP Law Group, P.L.L.C.

(57) ABSTRACT

Techniques for three dimensional capacitive sensing are described herein. The techniques include a system including a three dimensional transmitting electrode to emit charge having an electric field. The system may include a three dimensional receiving electrode to receive the charge creating a capacitance between the transmitting electrode and the receiving electrode.

18 Claims, 5 Drawing Sheets

200

400

MULTI-DIMENSIONAL ELECTRODES FOR CAPACITIVE SENSING

TECHNICAL FIELD

This disclosure relates generally to techniques for receiving sensor data from multiple directions. More specifically, the disclosure describes capacitive touch sensor electrodes having multiple dimensions.

BACKGROUND

Computing devices may incorporate capacitive sensing technology based on capacitive coupling. Capacitive sensors are used in computing devices to interface with a user of a computing device. For example, sensors provide virtual touch buttons, sliders, and touch panel interactions with a user. In some examples, a capacitive sensor may include a transmitting electrode configured to emit a charge generating an electric field, and receiving electrode to sense the electric field, such that the electrodes are coupled. The coupling of the electrodes creates a capacitance used as a reference. An external object having a charge or being conductive, such as a hand or finger of a user, may alter the reference capacitive coupling between the electrodes. The altered capacitance may be detected by an electronic component, such as a sensing circuit, or a controller of a given computing device depending on implementation.

DETAILED DESCRIPTION

The subject matter disclosed herein relates to multi-dimensional capacitive sensing mechanisms. The electrodes described herein include a transmitting electrode and a receiving electrode. The receiving electrode is configured to sense an electric field generated by the transmitting electrode, creating a capacitive coupling. A capacitive sensor may be coupled to the transmitting electrode and the receiving electrode. The capacitive sensor is configured to detect changes in the capacitive coupling between the electrodes. The electrodes are formed such that proximity of a charged or conductive object, such as a finger or a stylus, may be detected due to a change in the electric field from object in a plurality of directions with respect to the receiving and transmitting electrodes.

Figure 1:
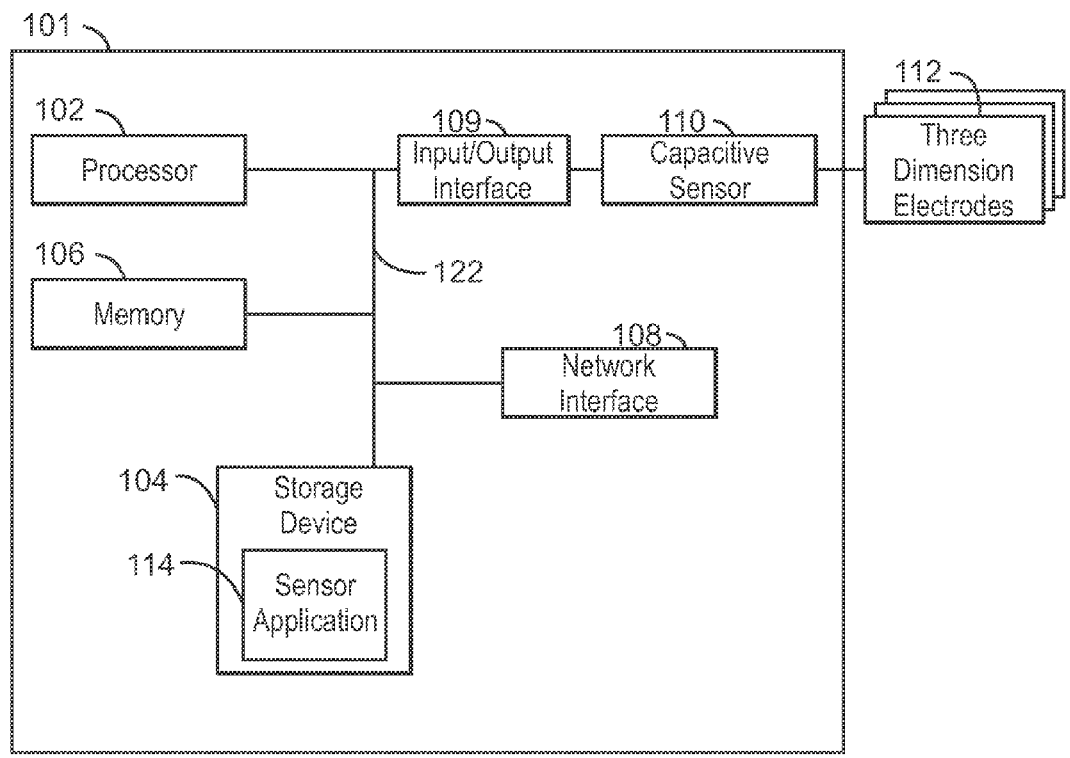
FIG. 1 is a block diagram of a computing system including three dimensional electrodes.

FIG. 1 is a block diagram of a computing system including three-dimensional electrodes. The computing system 100 may include a computing device 101 having a processor 102, a storage device 104 having a non-transitory computer-readable/writeable medium, a memory device 106, a network interface 108, an input/output (I/O) interface 109 configured to interface with a capacitive sensor 110 communicatively coupled to at least two three-dimensional electrodes 112. The three-dimensional electrodes may include one or more transmitting electrodes and one or more receiving electrodes.

The capacitive sensor 110 may be an integrated circuit configured to detect a capacitance between a transmitting electrode and a receiving electrode of the three-dimensional sensor electrodes 112. The capacitive sensor 110 may be implemented as logic, at least partially comprising hardware logic, such as an integrated circuit configured to detect changes in the capacitance between the three-dimensional sensors electrodes 112. In embodiments, the capacitive sensor 110 may be implemented in analog circuits, digital logic circuits, processors, or some combination thereof. The storage device 104 may include a sensor application 114. The sensor application 114 may be implemented by any suitable hardware or combination of hardware and programming code. Accordingly, a computing device operable to carry out the techniques described herein may include a processor, such as the processor 102, an input/output interface 109 that communicates with the capacitive sensor 110, and a tangible, non-transitory storage medium, such as the storage device 104, for storing programming code configured to implement the techniques disclosed herein. The sensor application 114 may be configured to receive data indicating changes in capacitance from the capacitive sensor 110. For example, a user (not shown) may interact with the computing device 101 at the three dimensional electrodes using a finger or hand, for example. In embodiments, the electrodes 112 referred to herein as a sensing mechanism, are configured to be three dimensional. A three-dimensional electrode, as referred to herein, is an electrode formed with measurements in all three outer dimensions of length, width and height such that a change in capacitance may be detected as a result of a charged or conductive object within the proximity of 270 to 360 degree space around the receiving and transmitting electrodes. The three-dimensional electrodes discussed herein have significant measurements in all three outer dimensions, rather than in two-dimensional geometry shape where the height of the shape is negligible in measurement comparing with the width and length when the shape is placed flat with its largest surface. The sensing mechanism described herein may also include the capacitive sensor 110 and the sensor application 114, wherein changes in capacitance may result in operations performed at the computing device 101 depending on a specific implementation.

The processor 102 may be a main processor that is adapted to execute stored instructions of the sensor application 114. The processor 102 may be a single core processor, a multi-core processor, a computing cluster, or any number of other configurations. The processor 102 may be implemented as Complex Instruction Set Computer (CISC) or Reduced Instruction Set Computer (RISC) processors, x86 Instruction set compatible processors, multi-core, or any other microprocessor, micro-controller or central processing unit (CPU).

The memory device 106 can include random access memory (e.g., SRAM, DRAM, zero capacitor RAM, SONOS, eDRAM, EDO RAM, DDR RAM, RRAM, PRAM, etc.), read only memory (e.g., Mask ROM, PROM, EPROM, EEPROM, etc.), flash memory, or any other suitable memory systems. The main processor 102 may be connected through a system bus 122 (e.g., PCI, ISA, PCI-Express, HyperTransport®, NuBus, etc.) to the network interface 108.

The block diagram of FIG. 1 is not intended to indicate that the computing device 101 is to include all of the components shown in FIG. 1. Further, the computing device 101 may include any number of additional components not shown in FIG. 1, depending on the details of the specific implementation. Furthermore, some or all of the components illustrated in FIG. 1 may be embodied as discrete components that are assembled on a printed circuit board (PCB), or as components integrated into the same integrated circuits, or as any other combination or form.

Figure 2:
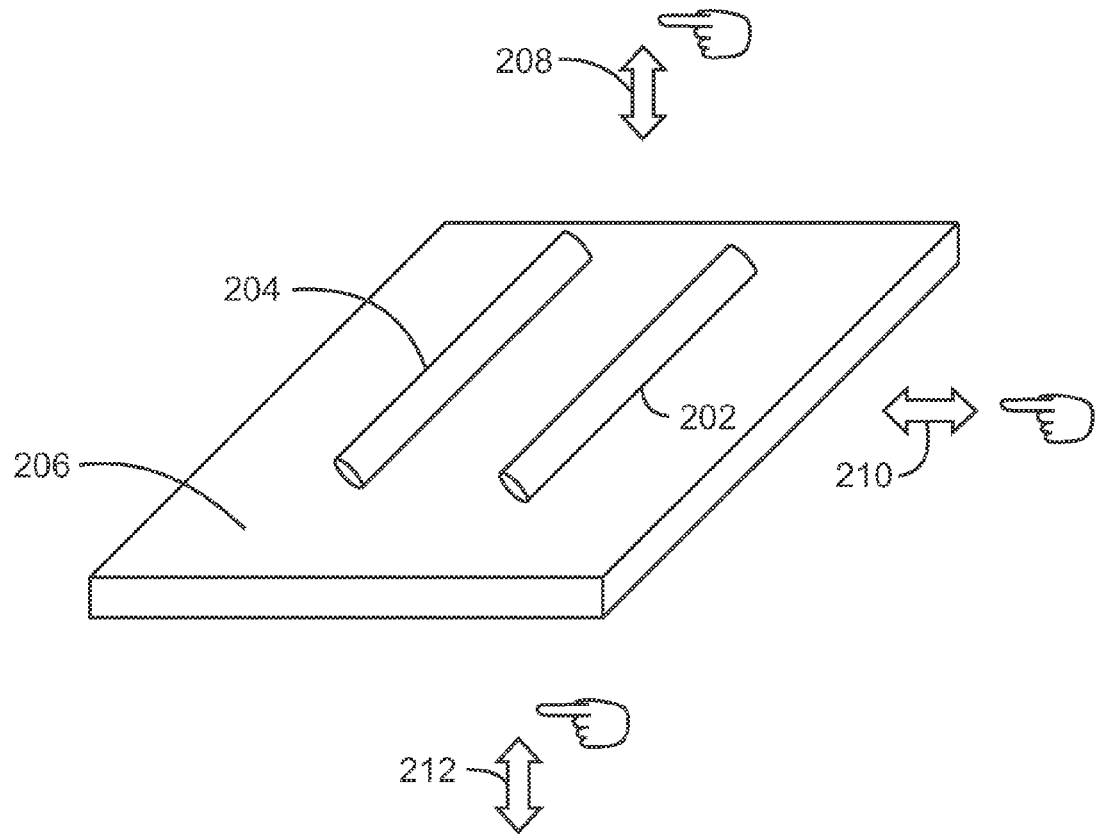
FIG. 2 is a perspective view of an example three dimensional electrodes for capacitive sensing.

FIG. 2 is a perspective view of an example three dimensional electrodes for capacitive sensing. The sensor 200 may include a transmitting electrode 202 and the receiving electrode 204 that may be disposed on a planar surface 206, a curved surface, or any other surfaces or structures that can be used to attach the sensor electrodes. In this example, the transmitting electrode 202 and the receiving electrode 204 are embodied in the shape of tubes or cylinders, rather than in two-dimensional geometry shape where the height of the shape is negligible in measurement comparing with the width and length when the shape is placed flat with its largest surface. The transmitting electrode 202 and the receiving electrode 204 form a capacitor having an electric field flux emitting from the transmitting electrode 202 and received at the receiving electrode 204. The planar surface 206 or any other surfaces or structures that are used to attach the sensor electrodes may be a component of a computing device, such as the computing device 101 of FIG. 1. For example, the planar surface 206 may be part of the back case of a mobile computing device, such as a mobile phone or a tablet computer, or a side of an all-in-one computer. FIG. 2 illustrates that, as indicated at 208, 210, 212, a user may interact with the computing device 101 by interacting at the top of the planar surface 206 as illustrated at 208, at the side as illustrated at 210, or at the bottom/opposite side to the top side as illustrated at 212. The user interaction at 208, 210 and 212 indicate the space that the user can interact with the computing device. The user interaction is not necessarily limited to the actual direction shown at 208, 210 and 212. For example, in the space indicated by 208, the top of the sensor electrodes, the user can interact with the computing device by moving the finger or hand vertically, perpendicular to the sensor electrodes, or horizontally, along the length of the sensor electrodes, or other movements in the space that is at the top of the sensor electrodes. The three dimensionality of the electrodes 202 and 204 enables a user to interact with the computing device 101 through an electrical field generated by the charge emitted by the transmitting electrode 202 and detected at the receiving electrode 204 at any position that is perpendicular to the length of the receiving and transmitting electrodes 204 and 202. The user interaction with the sensors can be in the direction that is perpendicular to the length of the sensor electrodes, or along the length of the sensor electrodes, or any combination of directions that are in a 270 to 360 degree space that is perpendicular to the length of the sensor electrodes. In embodiments, the diameter of the transmitter electrode may be larger than, equal to, or smaller than the diameter of the receiver electrode. In embodiments, there may be multiple transmitter electrodes and/or multiple receiver electrodes, and the number of the transmitter electrodes may or may not be the same as the number of the receiver electrodes.

Figure 3:
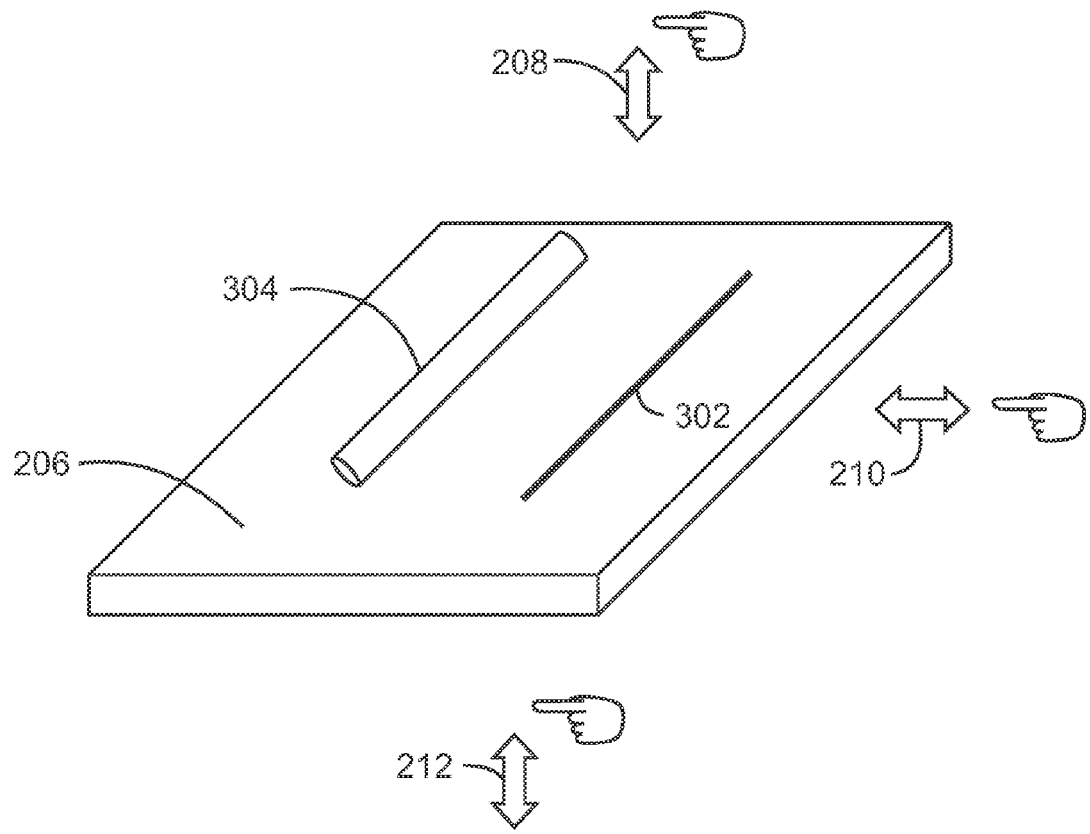
FIG. 3 is a perspective view of an example sensor with a transmitting electrode and a relatively larger receiving electrode.

FIG. 3 is a perspective view of an example sensor electrode structure with a transmitting electrode and a relatively larger receiving electrode. In embodiments, the multi-direction interaction sensing may be dependent on at least the three dimensionality of the transmitting and receiving electrode 304 and 302. As illustrated in FIG. 3, the diameter of a receiving electrode 304 is relatively larger with respect to the diameter of a transmitting electrode 302. In embodiments, the transmitting electrode 302 is in the shape of a metal wire and the receiving electrode 304 is in the shape of a metal tube. For example, the transmitting electrode 302 may be a metal wire of about 1 millimeter in diameter and 10 millimeter in length, and the receiving electrode may be a metal tube of about 3.5 millimeters in diameter with 0.5 millimeters in thickness and 10 millimeter in length. A change in capacitance may be detected by interaction as indicated by 208, 210, and 212 due to at least the three dimensionality of the receiving and transmitting electrodes 304 and 302.

Figure 4:
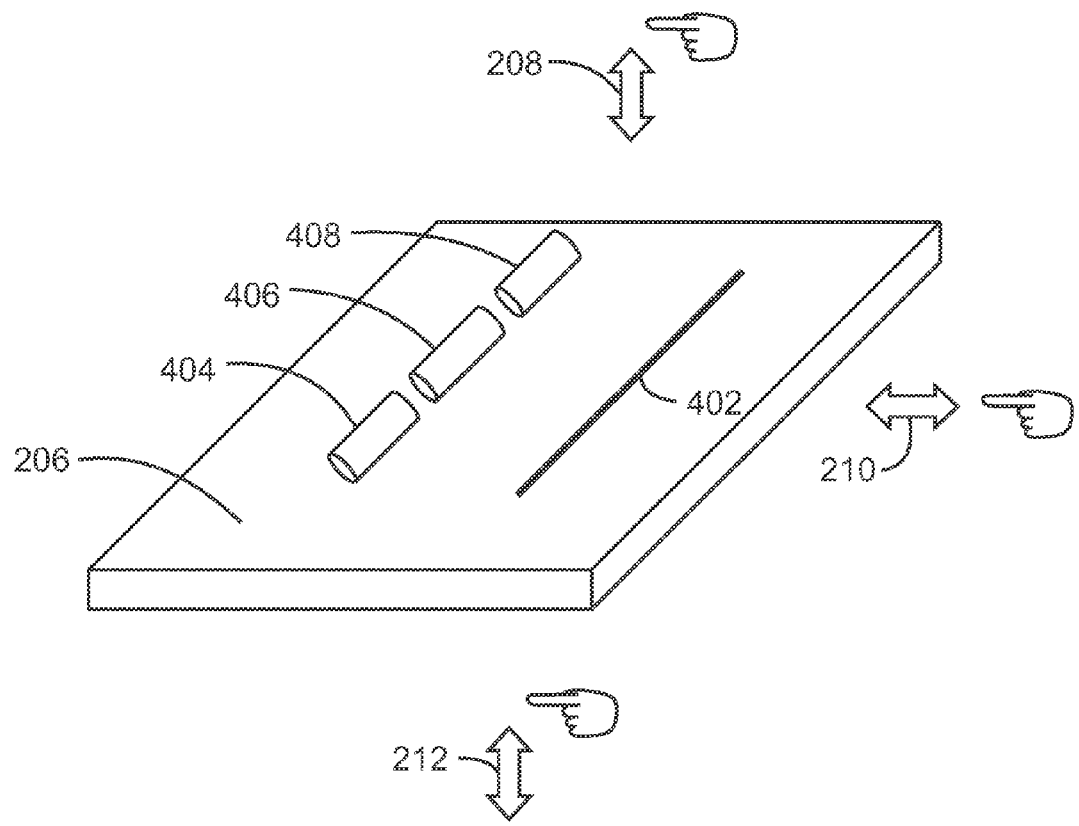
FIG. 4 is a perspective view of an example sensor with a transmitting electrode and multiple receiving electrodes.

FIG. 4 is a perspective view of an example sensor electrodes structure with a transmitting electrode and multiple receiving electrodes. As illustrated in FIG. 4, a transmitting electrode 402 may be communicatively coupled to multiple receiving electrodes 404, 406, 408. In one embodiment, each of the receiving electrodes 404, 406, 408 are relatively larger in diameter than the transmitting electrode 402. The capacitive coupling of the transmitting electrode 402 to multiple receiving electrodes 404, 406, 408, enables detection of multiple user interactions at the same side of the user interaction spaces indicated by 208, 210, and 212. For example, the user can interact with any one of the three receiver electrodes from any of the three directions indicated by 208, 210 and 212 to indicate any one of three virtual buttons being pressed. The user can also slide a finger along the length of the transmitter across different receiver electrodes to produce slider functions, from any of the three spaces indicated by 208, 210 and 212. The three-dimensional sensing from the three-dimensional sensor electrodes enables user interaction from multiple sides of the computing device.

Figure 5:
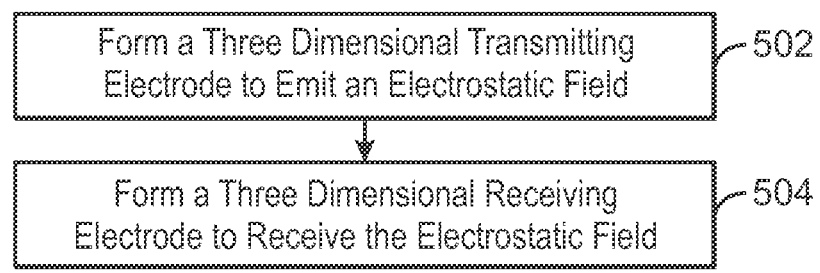
FIG. 5 is a block diagram illustrating a method of forming a three dimensional sensing mechanism.

FIG. 5 is a block diagram illustrating a method of forming a three dimensional sensing mechanism. At block 502, the method 500 may include forming a three dimensional transmitting electrode 502. The transmitting electrode may be configured to emit an electric field. At block 504, the method 500 may include forming a three dimensional receiving electrode to receive the electric field emitted by the transmitting electrode. The electric field received by the formed receiving electrode may create a capacitance coupling between the formed transmitting electrode and the formed receiving electrode.

In embodiments, the transmitting electrode and the receiving electrode are formed to be coupled to a sensor to detect the capacitance between the electrodes. A change in the capacitance may result from an interaction of a charged or conductive object, such as a finger or hand, with the electric field. The transmitting and receiving electrodes, formed as three dimensional electrodes, may enable the sensor to detect changes in capacitance within a 270 to 360 degree radius of the transmitting and receiving electrodes.

In one embodiment, the receiving electrode is relatively larger in diameter than the transmitting electrode. For example, the transmitting electrode may be formed as a wire of 1 millimeter in diameter and 10 millimeters in length, and the receiving electrode may be formed as a tube of 3.5 millimeters in diameter with 0.5 millimeter in thickness and 10 millimeters in length. In other embodiments, the receiving electrode is formed as one of multiple receiving electrodes to be capacitively coupled to the formed transmitting electrode. In some cases, forming one transmitting electrode and multiple receiving electrodes enables multiple interactions of a charged or conductive object with the capacitive coupling between the transmitting electrodes and the receiving electrodes.

Example 1

A method of forming capacitance sensing electrodes is described herein. The method may include forming a three dimensional transmitting electrode means to emit a charge having an electric field. The transmitting electrode means may include an electrode, such as a wire, or a tube configured to emit a charge applied to the transmitting electrode means. The method may include forming a three dimensional receiving electrode means to receive the charge and thereby creating a capacitance between the transmitting electrode means and the receiving electrode means. The receiving electrode means may include an electrode, such as a wire, or a tube configured to receive the charge of the transmitting electrode means creating the capacitance coupling between the transmitting and receiving electrode means. The transmitting and receiving electrodes are formed such that a change in capacitance may be detected anywhere within a 360 degree radius of either the transmitting electrode means or the receiving electrode means.

Example 2

A system is described herein. The system may include a three dimensional transmitting electrode, or a three dimensional transmitting electrode means, to emit a charge having an electric field. The system may include a three dimensional receiving electrode, or a three dimensional receiving electrode means, to receive the charge creating a capacitance between the transmitting electrode and the receiving electrode. In embodiments, the system may include a means for sensing the capacitance between the receiving electrode and the transmitting electrode. The means for sensing may be configured to detect changes in the capacitance. In embodiments, the means for sensing may include an integrated circuit such as an application specific integrated circuit, hardware logic, electronic logic, digital logic, and the like. The means for sensing may be coupled to a processing means, such as a processing device configured to carry out operations associated with the change in capacitance detected by the means for sensing.

Example 3

A capacitive sensing mechanism is described herein. The capacitive sensing mechanism may include a three dimensional transmitting electrode means to emit a charge having an electric field. The capacitive sensing mechanism may include a three dimensional receiving electrode means relatively larger than the transmitting electrode means, the receiving electrode means to receive the charge creating a capacitance between the transmitting electrode means and the receiving electrode means. The capacitive sensing mechanism may include a sensing means, such as a sensor coupled to the transmitting electrode means and the receiving electrode means to detect the capacitance between the transmitting electrode means and the receiving electrode means.

Some embodiments may be implemented in one or a combination of hardware, firmware, and software. Some embodiments may also be implemented as instructions stored on the tangible non-transitory machine-readable and/or writeable medium, which may be read and executed by a computing platform to perform the operations described. In addition, a machine-readable/writeable medium may include any mechanism for storing or transmitting information in a form readable/writeable by a machine, e.g., a computer. For example, a machine-readable/writeable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. A method, comprising:
    forming a transmitting electrode to emit a charge having an electric field; and
    forming a three dimensional receiving electrode to receive the charge to create a capacitance between the transmitting electrode and the receiving electrode receiving, wherein the receiving electrode is a tube; and
    coupling the transmitting electrode and the receiving electrode to a sensor to detect the capacitance between the transmitting electrode and the receiving electrode;
    wherein the sensor is to detect a change in capacitance between the transmitting electrode and receiving electrode at all angles from the receiving electrode.

2. The method of claim 1, wherein the receiving electrode is relatively larger than the transmitting electrode.

3. The method of claim 1, wherein the transmitting electrode and the receiving electrode are formed to be coupled to a sensor to detect the capacitance between the transmitting electrode and the receiving electrode.

4. The method of claim 3, wherein the sensor is formed to be communicatively coupled to a processing device to carry out operations at a computing device based on a detected change in capacitance.

5. The method of claim 1, wherein the transmitting electrode is a wire.

6. The method of claim 1, wherein the receiving electrode is one of a plurality of receiving electrodes formed to receive the charge of the transmitting electrode.

7. The method of claim 1, wherein the transmitting electrode is a wire about 1 millimeter in diameter and the tube is about 3 millimeters in diameter.

8. A system, comprising:
    a transmitting electrode to emit a charge having an electric field; and
    a three dimensional receiving electrode to receive the charge creating a capacitance between the transmitting electrode and the receiving electrode, wherein the receiving electrode is a tube; and
    a sensor coupled to the transmitting electrode and the receiving electrode to detect the capacitance between the transmitting electrode and the receiving electrode;
    wherein the sensor is to detect a change in capacitance between the transmitting electrode and receiving electrode at all angles from the receiving electrode.

9. The system of claim 8, wherein the receiving electrode is relatively larger than the transmitting electrode.

10. The system of claim 8, wherein the sensor is formed to be communicatively coupled to a processing device to carry out operations at a computing device based on a detected change in capacitance.

11. The system of claim 8, wherein the transmitting electrode is a wire.

12. The system of claim 8, wherein the receiving electrode is one of a plurality of receiving electrodes formed to receive the charge of the transmitting electrode.

13. The system of claim 8, wherein the transmitting electrode is a wire about 1 millimeter in diameter and the tube is about 3 millimeters in diameter.

14. A capacitive sensing mechanism, comprising:
    a transmitting electrode to emit a charge having an electric field;
    a three dimensional receiving electrode relatively larger than the transmitting electrode, the receiving electrode to receive the charge creating a capacitance between the transmitting electrode and the receiving electrode, wherein the receiving electrode is a tube; and
    a sensor coupled to the transmitting electrode and the receiving electrode to detect the capacitance between the transmitting electrode and the receiving electrode wherein the sensor is to detect a change in capacitance between the transmitting electrode and receiving electrode at all angles from the receiving electrode.

15. The capacitive sensing mechanism of claim 14, wherein the transmitting electrode is a wire.

16. The capacitive sensing mechanism of claim 14, wherein the receiving electrode is one of a plurality of receiving electrodes configured to receive the charge of the transmitting electrode.

17. The capacitive sensing mechanism of claim 14, wherein the transmitting electrode is a wire of about 1 millimeter diameter and the tube is about 3 millimeters.

18. The capacitive sensing mechanism of claim 14, wherein the sensor is communicatively coupled to a processing device to carry out operations at a computing device based on the detected change in capacitance.

\* \* \* \* \*